United States Patent
Yoon

(10) Patent No.: US 6,894,819 B2
(45) Date of Patent: May 17, 2005

(54) MICROMIRROR ACTUATOR AND METHOD OF MANUFACTURING THE SAME

(75) Inventor: Yong-seop Yoon, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 83 days.

(21) Appl. No.: 10/437,012

(22) Filed: May 14, 2003

(65) Prior Publication Data

US 2004/0095659 A1 May 20, 2004

(30) Foreign Application Priority Data

Nov. 19, 2002 (KR) .................................. 10-2002-0071972

(51) Int. Cl.⁷ .............................................. G02B 26/08
(52) U.S. Cl. ........................ 359/224; 359/291; 359/295
(58) Field of Search .................................. 359/224, 225, 359/226, 291, 295, 298, 872

(56) References Cited

U.S. PATENT DOCUMENTS

| | | | | |
|---|---|---|---|---|
| 5,978,128 | A | * 11/1999 | Yoon ............................ | 359/298 |
| 6,351,330 | B2 | * 2/2002 | Ko et al. ...................... | 359/298 |
| 6,356,378 | B1 | * 3/2002 | Huibers ....................... | 359/291 |
| 6,487,001 | B2 | * 11/2002 | Greywall ..................... | 359/292 |
| 6,490,073 | B2 | * 12/2002 | Yoon ............................ | 359/224 |
| 6,583,920 | B2 | * 6/2003 | Yoon et al. .................. | 359/290 |
| 6,603,894 | B1 | * 8/2003 | Pu ................................ | 385/18 |
| 6,690,850 | B1 | * 2/2004 | Greywall ..................... | 385/18 |
| 6,728,017 | B2 | * 4/2004 | Park ............................ | 359/224 |
| 6,747,390 | B2 | * 6/2004 | Park et al. ................... | 310/309 |
| 6,760,143 | B2 | * 7/2004 | Yoon ............................ | 359/290 |
| 6,819,809 | B2 | * 11/2004 | Yoon et al. ................... | 385/6 |
| 2004/0246558 | A1 | * 12/2004 | Yoon et al. .................. | 359/291 |

* cited by examiner

Primary Examiner—Ricky D. Shafer
(74) Attorney, Agent, or Firm—Sughrue Mion, PLLC

(57) ABSTRACT

A micromirror actuator includes a first substrate, at least one lower electrode, a micromirror, a two part second substrate, an upper electrode, a pair of support posts, and torsion bars. In the first substrate, a trench having a predetermined shape is formed. The lower electrode is formed in the trench. The micromirror faces the trench to be operative to pivot due to electrostatic forces and selectively to reflect incident light depending on pivoting positions thereof. The parts of the second substrate are formed on a portion of the first substrate and underneath the micromirror, respectively, and prevent the deformation of the micromirror. The upper electrode is formed on a portion of the second substrate on the first substrate and applies power to the micromirror. The pair of support posts protrude from the first substrate beside both sides of the trench. The torsion bars connect both sides of the micromirror to the pair of support posts.

9 Claims, 7 Drawing Sheets

MICROMIRROR ACTUATOR AND METHOD OF MANUFACTURING THE SAME

BACKGROUND OF THE INVENTION

This application claims the priority of Korean Patent Application No. 2002-71972, filed on Nov. 19, 2002, in the Korean Intellectual Property Office, the disclosure of which is incorporated herein in its entirety by reference.

1. Field of the Invention

Apparatuses and methods consistent with the present invention relate to a micromirror actuator and a method of manufacturing the same and, more particularly, to a micromirror actuator that prevents a micromirror from being deformed and includes a reflective surface having improved roughness and flatness, and a method for manufacturing the same.

2. Description of the Related Art

Micromirror actuators are generally used in optical switches, image displaying devices, and the like. In order to operate an optical switch or an image displaying device, a micromirror actuator pivots several micromirrors supported on some substrates by using electrostatic forces selectively to change an optical path of incident light.

A micromirror actuator 10 using electrostatic forces will be described with reference to FIGS. 1 and 2. A trench 5 is formed in a substrate 15. A pair of support posts 20 vertically protrude from the upper surface of the substrate 15 beside either side of the trench 5. A micromirror 30 is placed between the pair of support posts 20. A pair of torsion bars 25 are connected to the micromirror 30 and the pair of support posts 20. Thus, the micromirror 30 is supported by the pair of torsion bars 25 to be capable of pivoting.

The micromirror 30 includes a driving portion 30a that faces the trench 5 when the micromirror 30 is horizontal and a reflecting portion 30b that is opposite to the driving portion 30a and reflects incident light.

A lower electrode 37 is formed on the bottom of the trench 5 and a side electrode 40 is formed on a sidewall of the trench 5. Electrostatic forces are generated between the lower electrode 37 and the driving portion 30a and between the side electrode 40 and the driving portion 30a so as to drive the micromirror 30. In other words, the electrostatic force between the lower electrode 37 and the driving portion 30a acts to pivot the micromirror 30 downward. After the micromirror 30 pivots to some extent, the electrostatic force between the driving portion 30a and the side electrode 40 acts so that the micromirror 30 continues to pivot and reaches an upright position. The micromirror 30 is elastically supported by the torsion bars 25 so as to be capable of pivoting. When the electrostatic forces are released, the micromirror 30 returns to the horizontal state due to the returning force of the torsion bars 25.

A process of manufacturing a micromirror of the micromirror actuator having the above-described structure will now be described. The trench 5 is formed in the substrate 15. The resultant structure is coated with a photoresist (not shown) to a predetermined thickness and an aluminum film forming the micromirror 30 is deposited thereon. Thereafter, the photoresist is removed to complete the micromirror structure. Here, a plurality of holes 31 are formed in the reflecting portion 30b in order to reduce the time required for removing the photoresist.

In the micromirror actuator having the above-described structure, light is lost via the holes 31.

In the process of manufacturing the micromirror actuator, as shown in FIG. 3, the aluminum film is deformed due to a stress remaining in the aluminum film when being deposited and heat generated by plasma when removing the photoresist. In order to solve this problem, in the prior art, a micromirror is made thicker in order to increase the stiffness of the micromirror. In this case, it is very difficult to reduce the deformation of the aluminum film due to a limitation in the deposition thickness of the aluminum film of the micromirror.

SUMMARY OF THE INVENTION

Accordingly, the invention provides an actuator for actuating a micromirror that is prevented from being deformed and includes a reflective surface having improved roughness and flatness, and a method for manufacturing the same.

According to an aspect of the present invention, there is provided a micromirror actuator which includes a first substrate, at least one lower electrode, a micromirror, a two part second substrate, an upper electrode, a pair of support posts, and torsion bars. In the first substrate, a trench having a predetermined shape is formed. The at least one lower electrode is formed in the trench. The micromirror faces the trench to be capable of pivoting due to electrostatic forces and selectively reflects incident light depending on pivoting positions thereof. The two parts of the second substrate are formed on a portion of the first substrate and underneath the micromirror, respectively, and prevent the deformation of the micromirror. The upper electrode is formed on a portion of the second substrate disposed on the first substrate and applies power to the micromirror. The pair of support posts protrude from the first substrate proximate to sides of the trench. The torsion bars connect sides of the micromirror to the pair of support posts to support the micromirror so that the micromirror pivots. Here, the micromirror pivots due to an electrostatic force generated by a difference between potentials applied to the micromirror and the lower electrode.

The trench includes a first trench that is formed in the first substrate to a predetermined depth and a second trench that is formed deeper than the first trench, and the micromirror includes a reflecting portion that faces the first trench when the micromirror is horizontal and reflects incident light and a driving portion that faces the second trench and is actuated by an electrostatic force.

The lower electrode includes a first lower electrode that is formed on the bottom of the first trench and a second lower electrode that is formed on the bottom of the second trench and one sidewall of the second trench facing the driving portion when the micromirror pivots. Here, the first lower electrode blocks an electrostatic force between the reflecting portion and the second lower electrode when the micromirror is actuated.

According to another aspect of the present invention, there is also provided a method of manufacturing a micromirror actuator. A trench is formed in a first substrate. At least one lower electrode is formed in the trench. A second substrate is bonded to the first substrate in which the trench and the lower electrode are formed. Areas of the second substrate corresponding to support posts are etched to form support post holes. A metal film is deposited on the second substrate and patterned to form an upper electrode, a micromirror, torsion bars and the support posts. A portion of the second substrate corresponding the torsion bars is removed.

When the forming the trench, the first substrate is coated with a photoresist. A mask having a pattern corresponding to the trench is prepared on the photoresist and the photoresist is exposed. Thereafter, an area of the photoresist corresponding to the trench is removed and the first substrate is etched via the removed area.

When forming the lower electrode, a metal film is deposited on the trench, and then the metal film is patterned by using photolithography.

An upper surface of the second substrate adhered to the first substrate is removed using a polishing process so that the second substrate has a predetermined thickness.

BRIEF DESCRIPTION OF THE DRAWINGS

The above features and advantages of the present invention will become more apparent by describing in detail exemplary embodiments thereof with reference to the attached drawings, in which.

DETAILED DESCRIPTION OF ILLUSTRATIVE NON-LIMITING EMBODIMENTS OF THE INVENTION

Figure 1:
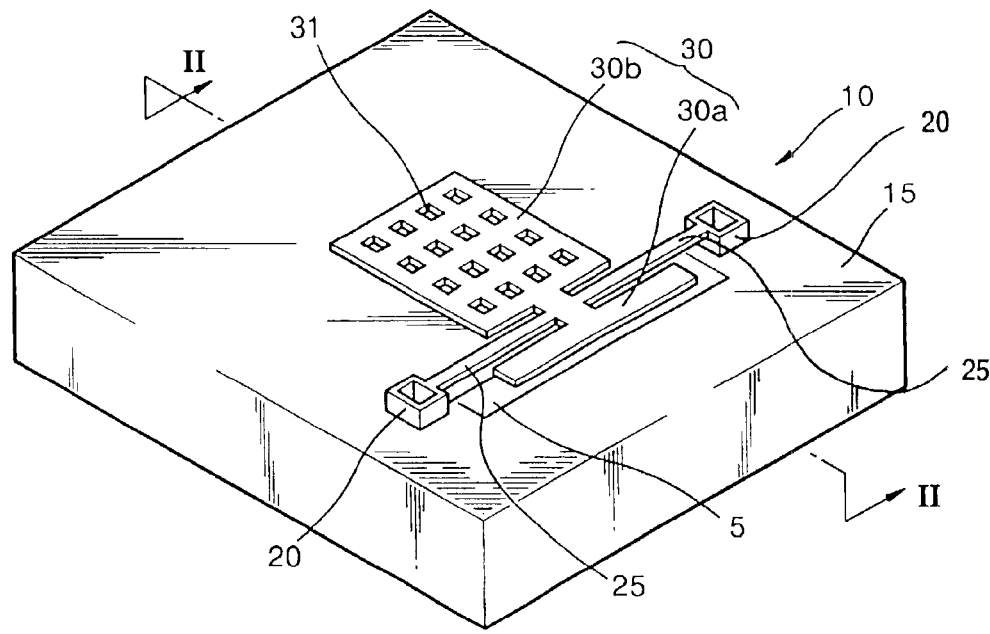
FIG. 1 is a schematic perspective view of a conventional micromirror actuator.
Figure 2:
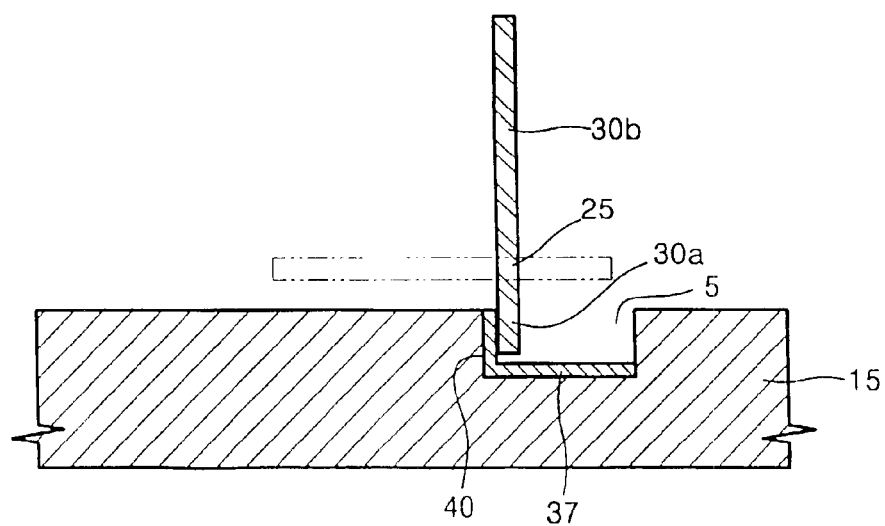
FIG. 2 is a cross-sectional view taken along line II—II of FIG. 1.
Figure 3:
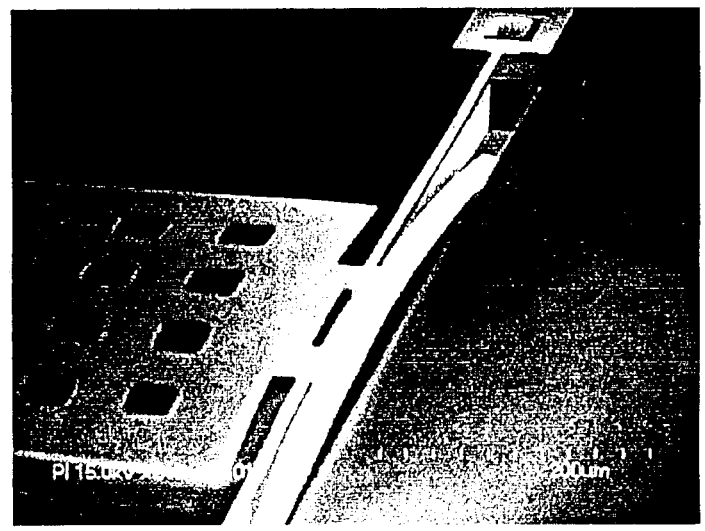
FIG. 3 is a view explaining the degree of the deformation of a micromirror of the micromirror actuator shown in FIG. 1.
Figure 4:
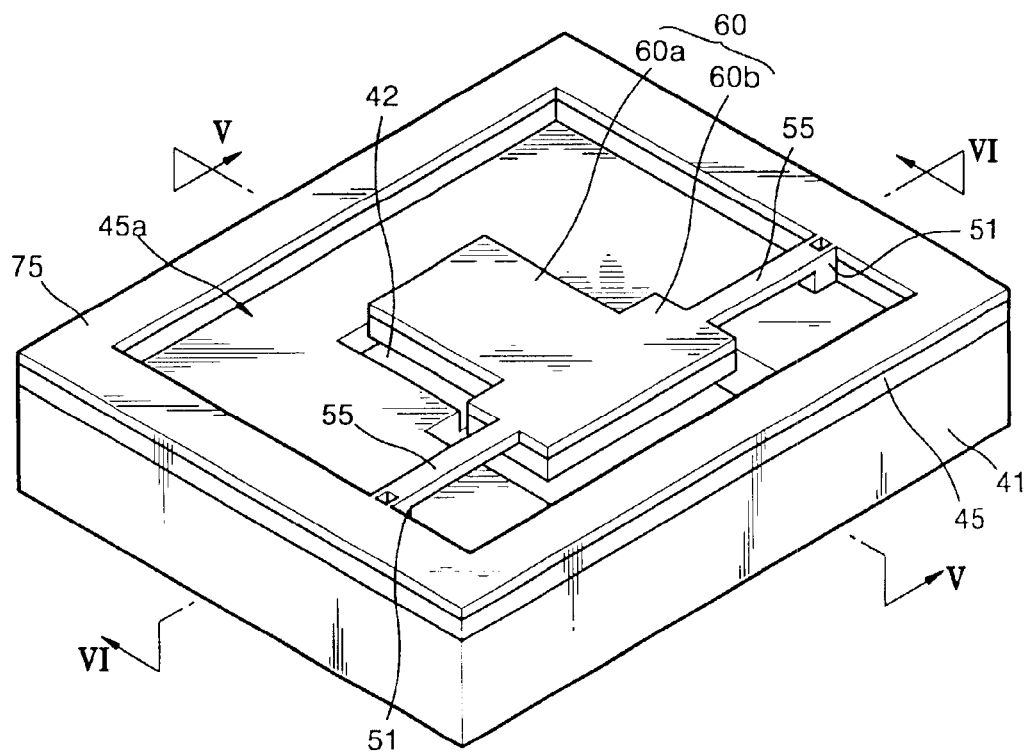
FIG. 4 is a schematic perspective view of a micromirror actuator according to an exemplary embodiment of the present invention.
Figure 5:
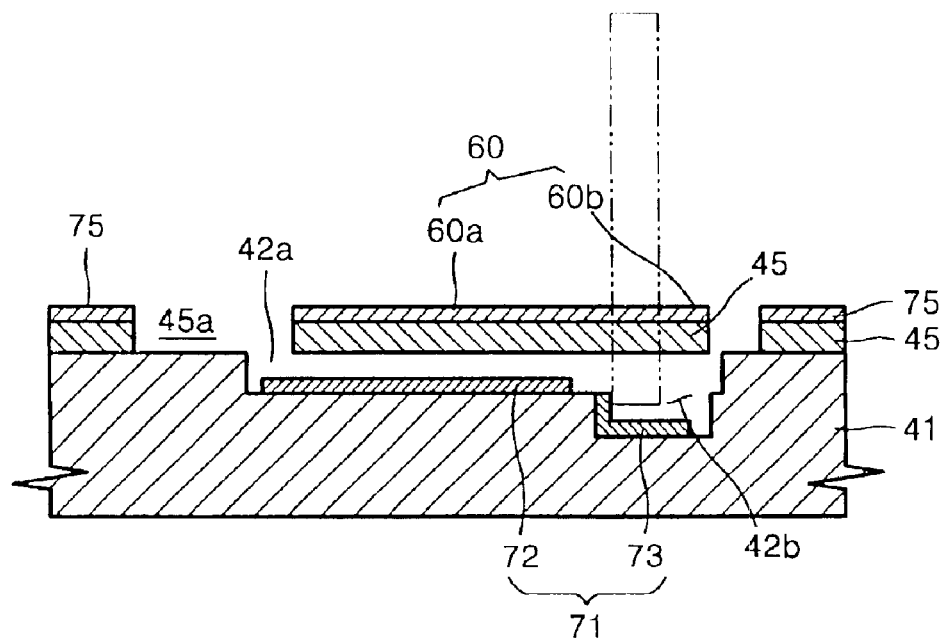
FIG. 5 is a cross-sectional view taken along line V—V of FIG. 4.
Figure 6:
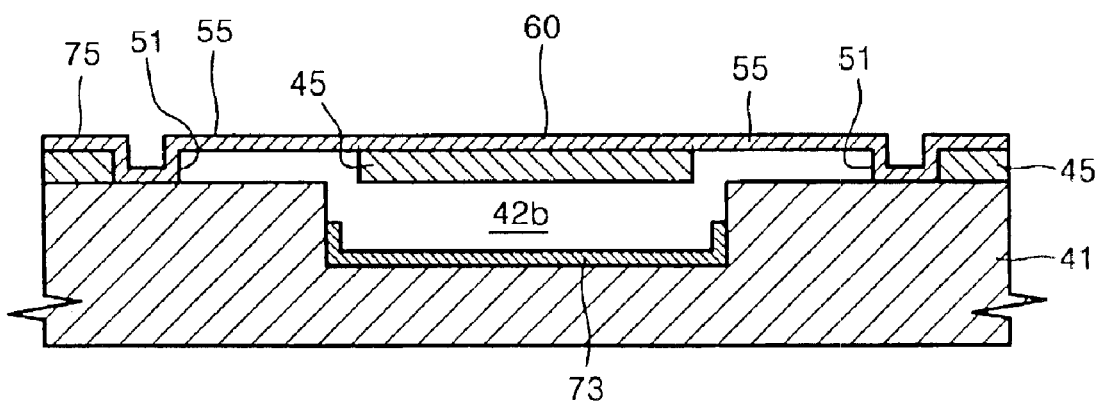
FIG. 6 is a cross-sectional view taken along ling VI—VI of FIG. 4.

Referring to FIGS. 4 through 6, a micromirror actuator according to an illustrative, non-limiting embodiment of the present invention includes a first substrate 41, at least one lower electrode 71, a micromirror 60, a two part second substrate 45, an upper electrode 75, support posts 51, and torsion bars 55. A trench 42 having a predetermined shape is formed in the first substrate 41. The at least one lower electrode 71 is formed in the trench 42. The micromirror 60 faces the trench 42 to be capable of pivoting due to electrostatic forces. The two parts or portions of the second substrate 45 are placed on a portion of the first substrate 41 and underneath the micromirror 60, respectively. The upper electrode 75 applies power to the micromirror 60. The support posts 51 and the torsion bars 55 support the micromirror 60 so that the micromirror 60 pivots.

The trench 42 is divided into first and second trenches 42a and 42b according to its depth and shape. In other words, the first trench 42a is formed in the first substrate 41 to a predetermined depth and faces a reflecting portion 60a of the micromirror 60 that will be described later. The second trench 42b is adjacent to the first trench 42a and formed deeper than the first trench 42a. The shape of the second trench 42b corresponds to the shape of a driving portion 60b of the micromirror 60 that will be described later. Thus, in FIG. 5, as marked with dotted lines, in an event that the micromirror 60 is vertical, the sidewall of the second trench 42b, in which a step is formed due to a difference between depths of the first and second trenches 42a and 42b, serves as a stopper that confines the pivoting of the micromirror 60 due to the electrostatic forces.

The micromirror 60 includes the reflecting portion 60a that faces the first trench 42a when the micromirror 60 is horizontal and reflects incident light and the driving portion 60b that faces the second trench 42b when the micromirror 60 is horizontal and is driven by electrostatic forces. The micromirror 60 selectively reflects incident light depending on pivoting portions thereof.

The lower electrode 71 is divided into first and second lower electrodes 72 and 73 according to position and function.

The first lower electrode 72 is formed on the bottom of the first trench 42a and blocks an electrostatic force between the reflecting portion 60a and the second lower electrode 73 when the micromirror 60 pivots. For example, a voltage may be applied to the first lower electrode 72 to form an equipotential surface with the reflecting portion 60a so that an electrostatic force does not act between the first lower electrode 72 and the reflecting portion 60a.

The second lower electrode 73 is formed on the bottom of the second trench 42b and on a sidewall of the trench 42b that faces the driving portion 60b when the micromirror 60 pivots.

In this case, the reflecting portion 60a is opposite to the driving portion 60b. Thus, in a case where an electrostatic force is generated between the reflecting portion 60a and the second lower electrode 73, an electrostatic force between the driving portion 60b and the second lower electrode 73 attenuates.

Accordingly, by using the first lower electrode 72, the pivoting of the micromirror 60 is achieved due to the electrostatic force between the driving portion 60b and the second lower electrode 73, excluding the electrostatic force between the reflecting portion 60a and the lower electrode 73.

In order to form the second substrate 45, a member made of silicon is separated into two portions using a semiconductor manufacturing process such as an etching process. An internal space 45a is formed in the separation process. The internal space 45a provides a space in which the torsion bars 55 can pivot when the micromirror 60 pivots.

Forming a portion of the second substrate 45 underneath the micromirror 60 can prevent the deformation of the micromirror 60. Thus, the flatness of the reflection portion 60a can be improved.

The upper electrode 75, the support posts 51, the torsion bars 55, and the micromirror 60 form a single body. In other words, before the second substrate 45 is divided into two portions, grooves are formed in predetermined positions of the second substrate 45 corresponding to the support posts 51, and then a metal film, such as an aluminum film, is deposited, thereby forming a single body. The single body is classified into components according to function.

The upper electrode 75 is formed on a portion of the second substrate 45 and applies power to the micromirror 60. In this case, when power is applied to the micromirror 60, the torsion bars 55 are used as an electrical path.

The support posts 51 make a pair, and each of them protrudes from the first substrate 41 beside either side of the trench 42.

The torsion bars 55 make a pair and connect both sides of the micromirror 60 to the pair of support posts 51 so that the micromirror 60 can pivot.

As described above, since the deformation of a micromirror can be prevented by using a second substrate, the flatness of the micromirror can be improved. Thus, when the micromirror is used in an optical switch, the correct transmission of an optical signal can be realized. Also, when the micromirror is used in an image displaying device, efficiency of light sources can be increased.

Hereinafter, a method of manufacturing the micromirror actuator according to an embodiment of the present invention will be described with reference to FIGS. 7A through 7H and FIGS. 8A through 8C.

A trench 42 is formed in a first substrate 41. At least one lower electrode 71 is formed in the trench 42. A second substrate 44 is adhered onto the upper surface of the first substrate 41 in which the trench 42 and the lower electrode 71 are formed. Areas of the second substrate 44 corresponding to support posts are etched to form support post holes 44a. A metal film is deposited on the second substrate 44 and patterned to form an upper electrode 75, a micromirror 60, torsion bars 55, and support posts 51. A portion of the second substrate 44 corresponding to the torsion bars 55 is removed.

A process of forming the trench 42 in the first substrate 41 will be described with reference to FIGS. 7A through 7D.

Figure 7A:
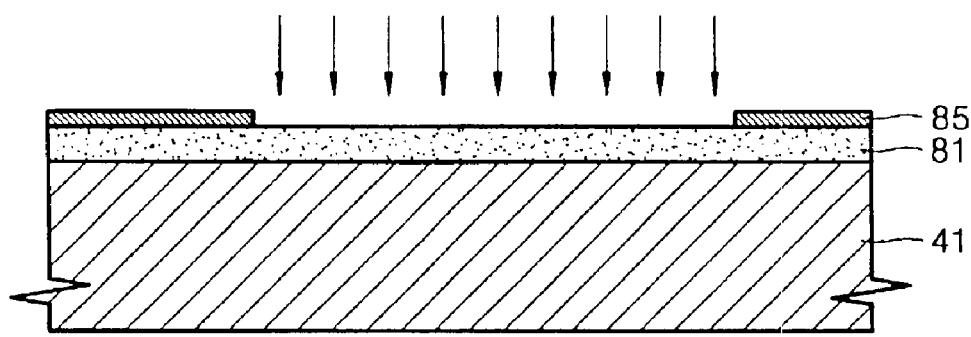
FIGS. 7A through 7H are cross-sectional views, taken along line V—V of FIG. 4, for explaining a process of manufacturing the micromirror actuator according to an exemplary embodiment of the present invention.

As shown in FIG. 7A, the first substrate 41 is coated with a photoresist 81. A mask 85 having a pattern corresponding to the trench 42 is deposited on the photoresist 81, and then the photoresist 81 is exposed.

Figure 7B:
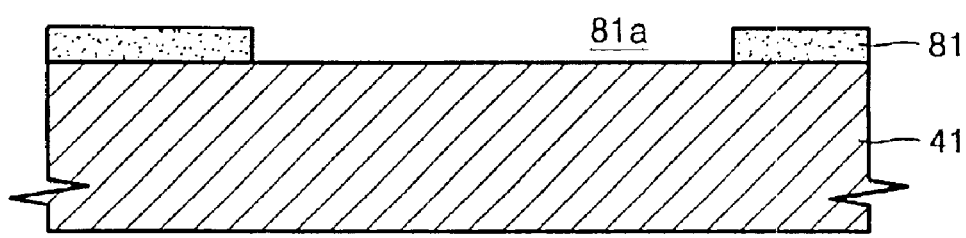
Figure 7C:
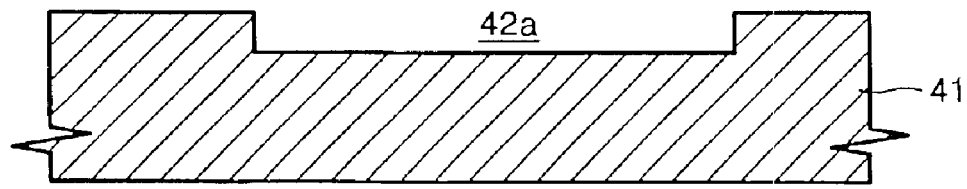

As shown in FIGS. 7B and 7C, an area 81a of the photoresist 81 corresponding to the trench 42 is removed. The first substrate 41 is etched via the removed area, and thus the trench 42 is formed.

Figure 7D:
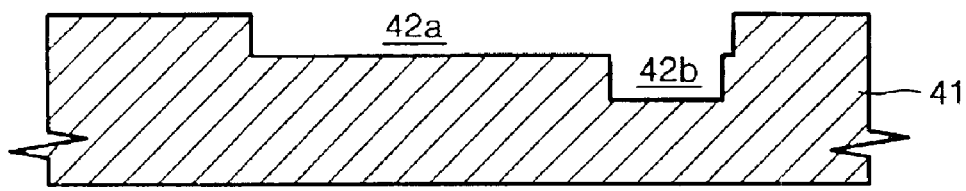

As shown in FIG. 7D, the trench 42 includes a first trench 42a that is formed in the first substrate 41 to a predetermined depth and a second trench 42b that is formed near to and deeper than the first trench 42a. In this case, the second trench 42b may be formed by repeating the steps described with reference to FIGS. 7A through 7C.

Figure 7E:
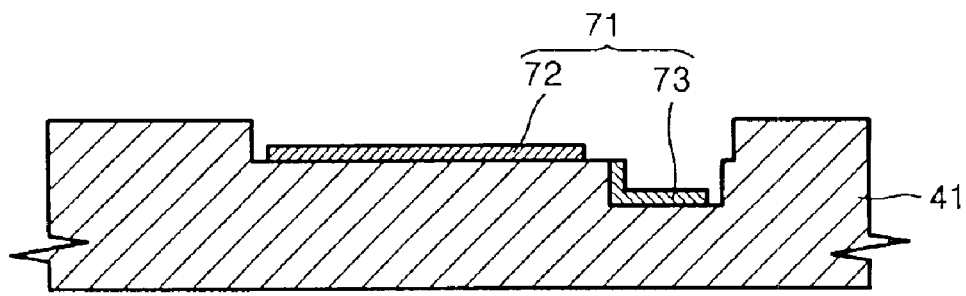

Referring to FIG. 7E, a process of forming the lower electrode 71 includes a step of depositing a metal film having a high conductivity on the trench 42 and a step of etching and patterning the metal film using photolithography.

In this case, the lower electrode 71 includes a first lower electrode 72 that is formed on the bottom of the first trench 42a and a second lower electrode 73 that is formed on the bottom of the second trench 42b and on one sidewall of the second trench 42b. The first and second lower electrodes 72 and 73 are separated by depositing a metal film on the entire surface of the first and second trenches 42a and 42b, and etching and patterning the metal film.

Figure 7F:
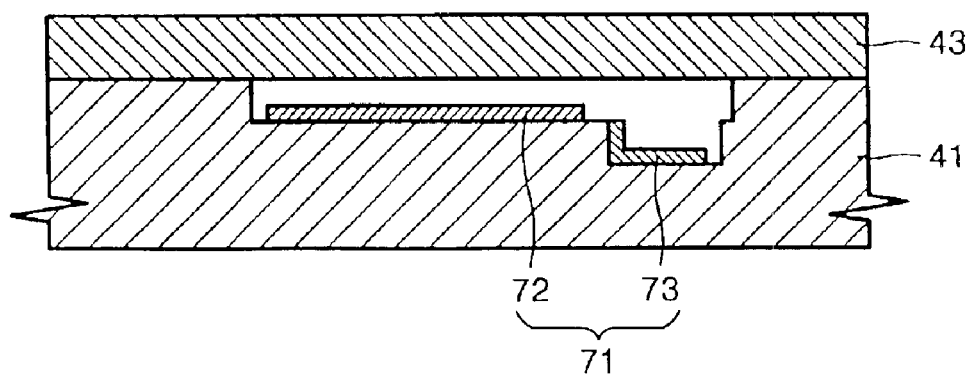

As shown in FIG. 7F, a second substrate 43 is adhered onto the first substrate 41 using a bonding process. At this stage, the second substrate 43 is formed of silicon. The second substrate 43 has the original form of the second substrate 45 shown in FIG. 5 and is thicker than the second substrate 45.

In a case where the second substrate 43 is thin, a portion of the second substrate 43 under which the trench 42 is formed is deformed, which deteriorates the flatness of the micromirror 60 that will be formed in a subsequent process. Due to this, the second substrate 43 must be thick. In an event that the thickness of the second substrate 43 is maintained, the velocity of actuating the micromirror 60 is reduced.

Figure 7G:
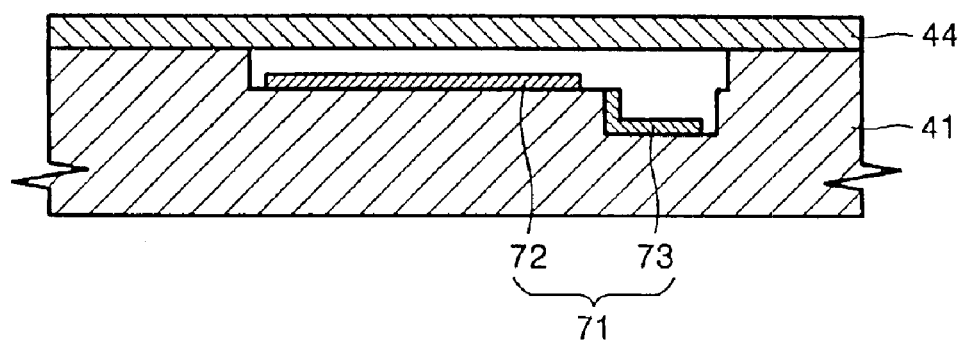

Therefore, taking the above-described problems into account, as shown in FIG. 7G, after the bonding process, the upper surface of the second substrate 43 is removed using a polishing process so that the second substrate 43 has a predetermined thickness. As a result, a second substrate 44 having the same thickness as the second substrate 45 shown in FIG. 5 is completed.

Figure 8A:
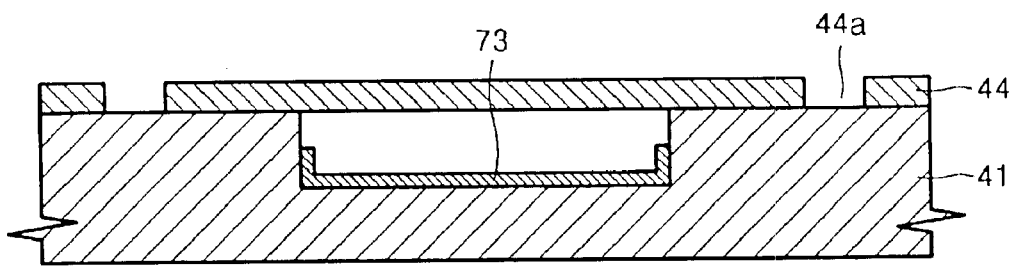
FIGS. 8A through 8C are cross-sectional views, taken along line VI—VI of FIG. 4, for explaining the process of manufacturing the micromirror actuator according to an exemplary embodiment of the present invention.
Figure 8B:
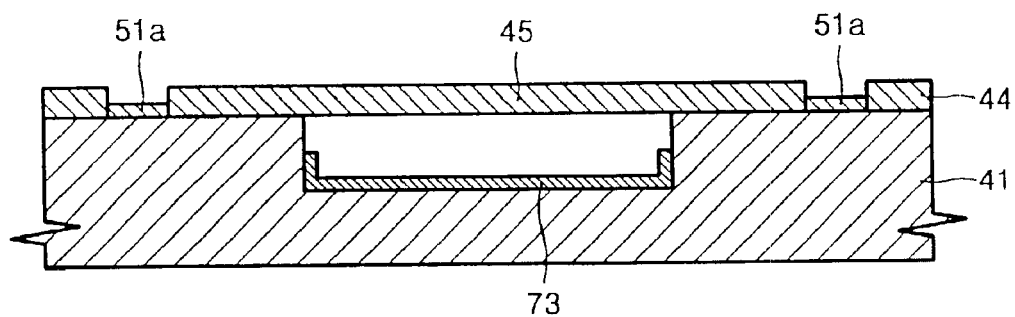

As shown in FIG. 8A, areas of the second substrate 44 corresponding to the support posts 51 are etched to form support post holes 44a. As shown in FIG. 8B, metal films are deposited on the bottoms of the support post holes 44a to complete lower surfaces 51a of support posts 51.

Figure 7H:
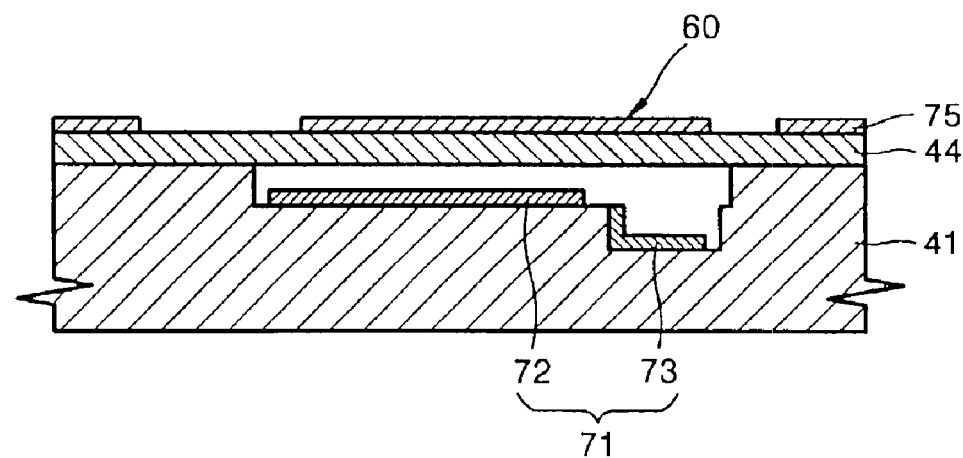
Figure 8C:
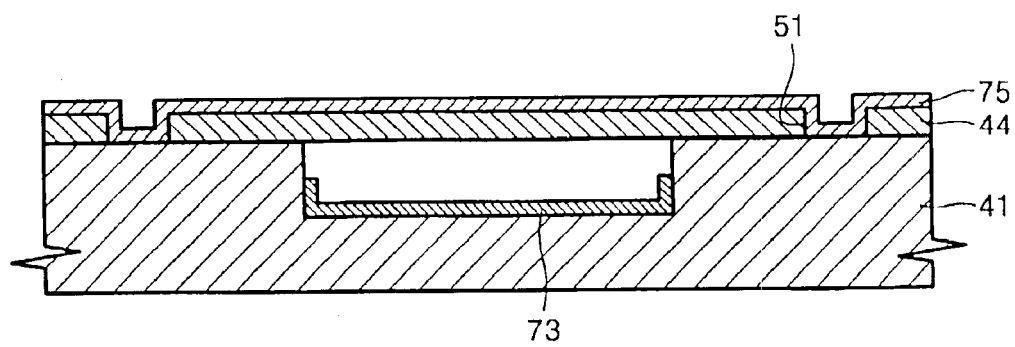

As shown in FIG. 7H and 8C, the second substrate 44 is coated with a metal film and patterned in a shape corresponding to the upper electrode 75, the micromirror 60, the torsion bars 55, and the support posts 51. This patterning process is performed using a photolithographic process such as reactive ion etching (RIE). This photolithographic process is well-known to one of ordinary skill in the art, and thus its descriptions will be omitted.

The structures and functions of the upper electrode 75, the micromirror 60, the torsion bars 55, and the support posts 51 were previously described, and thus their detailed descriptions will be omitted.

The structure shown in FIGS. 4 through 6 can be completed by removing an area of the second substrate 44 corresponding to the torsion bars 55.

As described above, since a process of manufacturing a micromirror actuator according to an embodiment of the present invention can be changed, a step of forming a hole in a micromirror is not necessary. Thus, loss of light via the hole can be prevented. Also, the deformation of the micromirror can be prevented by forming a second substrate and maintaining the same. As a result, the flatness of a reflecting portion of the micromirror can be improved and the roughness of the reflecting portion can be reduced, thereby greatly reducing loss of light reflected and transmitted by the micromirror.

It is contemplated that numerous modifications may be made to the micromirror actuator and method of manufacturing the same of the present invention without departing from the spirit and scope of the invention as defined in the following claims.

What is claimed is:

1. A micromirror actuator comprising:
   a first substrate in which a trench having a predetermined shape is formed;
   at least one lower electrode that is formed in the trench;
   a micromirror that faces the trench and is operative to pivot due to electrostatic forces and selectively reflects incident light depending on pivoting positions thereof;
   a second substrate having two parts that are formed on a portion of the first substrate and underneath the micromirror, respectively, and prevents the deformation of the micromirror;
   an upper electrode that is formed on the part of the second substrate disposed on the first substrate and applies power to the micromirror;
   a pair of support posts that protrude from the first substrate proximate to sides of the trench; and
   torsion bars that connect sides of the micromirror to the pair of support posts to support the micromirror so that the micromirror pivots,
   wherein the micromirror pivots due to an electrostatic force generated by a difference between potentials applied to the micromirror and the lower electrode.

2. The micromirror actuator of claim 1, wherein the two parts of the second substrate are formed by dividing a member into a portion that is formed on the first substrate and a portion that is formed underneath the micromirror, using a semiconductor process.

3. The micromirror actuator of claim 1, wherein the upper electrode, the torsion bars, the support posts, and the micromirror form a single body.

4. The micromirror actuator of claim 1, wherein the trench comprises a first trench that is formed in the first substrate to a predetermined depth and a second trench that is formed deeper than the first trench, and the micromirror comprises a reflecting portion that faces the first trench when the micromirror is horizontal and reflects incident light and a driving portion that faces the second trench and is actuated by an electrostatic force.

5. The micromirror actuator of claim 4, wherein the two parts of the second substrate are formed by dividing a member into a portion that is formed on the first substrate and a portion that is formed underneath the micromirror, using a semiconductor process.

6. The micromirror actuator of claim 4, wherein the upper electrode, the torsion bars, the support posts, and the micromirror form a single body.

7. The micromirror actuator of claim 4, wherein the lower electrode comprises:

a first lower electrode that is formed on a bottom of the first trench; and a second lower electrode that is formed on a bottom of the second trench and one sidewall of the second trench facing the driving portion when the micromirror pivots, wherein the first lower electrode blocks an electrostatic force between the reflecting portion and the second lower electrode when the micromirror is actuated.

8. The micromirror actuator of claim 7, wherein the two parts of the second substrate are formed by dividing a member into a portion that is formed on the first substrate and a portion that is formed underneath the micromirror, using a semiconductor process.

9. The micromirror actuator of claim 7, wherein the upper electrode, the torsion bars, the support posts, and the micromirror form a single body.

* * * * *